United States Patent
Ta et al.

(10) Patent No.: US 11,652,116 B2
(45) Date of Patent: May 16, 2023

(54) LIGHT DETECTION APPARATUS WITH ARRAY CONTROLLED BY SHIELDED LIGHT DETECTORS AND ELECTRONIC DEVICE

(71) Applicant: KABUSHIKI KAISHA TOSHIBA, Minato-ku (JP)

(72) Inventors: Tuan Thanh Ta, Kawasaki (JP); Akihide Sai, Yokohama (JP); Hidenori Okuni, Yokohama (JP); Toshiki Sugimoto, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 311 days.

(21) Appl. No.: 16/816,690

(22) Filed: Mar. 12, 2020

(65) Prior Publication Data

US 2021/0074743 A1    Mar. 11, 2021

(30) Foreign Application Priority Data

Sep. 5, 2019   (JP) .............................. JP2019-162235

(51) Int. Cl.
*H01L 27/146*   (2006.01)
*G01S 7/497*    (2006.01)
*G01S 7/481*    (2006.01)

(52) U.S. Cl.
CPC ........ *H01L 27/1461* (2013.01); *G01S 7/4816* (2013.01); *G01S 7/497* (2013.01); *H01L 27/14605* (2013.01); *H01L 27/14623* (2013.01); *H01L 27/14643* (2013.01)

(58) Field of Classification Search
CPC ........... H01L 27/1461; H01L 27/14605; H01L 27/14623; H01L 27/14643; H01L 27/14634; G01S 7/4816; G01S 7/497; G01S 7/4863; G01S 17/42; G01S 17/10; G01S 17/89
See application file for complete search history.

(56) References Cited

U.S. PATENT DOCUMENTS 7,262,402 B2   8/2007   Niclass et al.
7,858,917 B2   12/2010  Stern et al.
7,897,906 B2   3/2011   Deschamps et al.
(Continued)

FOREIGN PATENT DOCUMENTS

JP       06-224463         8/1994
JP       2018-173379 A    11/2018
(Continued)

*Primary Examiner* — Jennifer D Bennett
(74) *Attorney, Agent, or Firm* — Oblon, McClelland, Maier & Neustadt, L.L.P.

(57) ABSTRACT

A light detection apparatus has an array of first light detectors arranged at a first interval and configured to convert reception light into first signals, second light detectors having a first crosstalk rate and configured to convert reception light into second signals, wherein surfaces of the second light detectors are shielded from light, third light detectors having a second crosstalk rate different from the first crosstalk rate and configured to convert reception light into third signals, wherein surfaces of the third light detectors are shielded from light, and control circuitry configured to control an operation point of the array based on the second signals and the third signals.

8 Claims, 12 Drawing Sheets

(56) References Cited

U.S. PATENT DOCUMENTS

| | | | |
|---|---|---|---|
| 8,410,416 B2 | 4/2013 | Eldesouki et al. | |
| 8,859,944 B2 | 10/2014 | Eldesouki et al. | |
| 9,201,138 B2 | 12/2015 | Eisele et al. | |
| 9,234,964 B2 | 1/2016 | Mheen et al. | |
| 9,823,353 B2 | 11/2017 | Eichenholz et al. | |
| 10,304,877 B2 | 5/2019 | Mellot et al. | |
| 11,205,672 B2* | 12/2021 | Oh | H01L 27/14636 |
| 2011/0019036 A1* | 1/2011 | Okado | H04N 5/361 |
| | | | 348/E9.037 |
| 2015/0378013 A1* | 12/2015 | Bikumandla | G01S 7/497 |
| | | | 250/208.2 |
| 2017/0031009 A1* | 2/2017 | Davidovic | G01S 7/4865 |
| 2018/0016441 A1 | 1/2018 | Gnecchi et al. | |
| 2018/0143324 A1 | 5/2018 | Keilaf et al. | |
| 2018/0164412 A1 | 6/2018 | Gnecchi et al. | |
| 2018/0164413 A1 | 6/2018 | Gnecchi et al. | |
| 2018/0164414 A1 | 6/2018 | Gnecchi et al. | |
| 2018/0195900 A1 | 7/2018 | Delic | |
| 2018/0284239 A1 | 10/2018 | Lachapelle et al. | |
| 2018/0364331 A1 | 12/2018 | Yamasaki | |
| 2019/0018117 A1 | 1/2019 | Perenzoni et al. | |
| 2019/0113385 A1 | 4/2019 | Fukuchi et al. | |
| 2019/0129012 A1 | 5/2019 | Ikuta et al. | |
| 2019/0146088 A1 | 5/2019 | Pacala et al. | |
| 2019/0154815 A1 | 5/2019 | Oohata | |
| 2019/0154832 A1 | 5/2019 | Maleki et al. | |
| 2019/0154835 A1 | 5/2019 | Maleki et al. | |
| 2019/0235061 A1 | 8/2019 | Ren et al. | |
| 2019/0349544 A1* | 11/2019 | Lee | H01L 27/14621 |
| 2020/0018832 A1 | 1/2020 | Azuma et al. | |
| 2020/0119067 A1* | 4/2020 | Choi | H01L 27/14607 |
| 2021/0013249 A1* | 1/2021 | Yang | H01L 27/1463 |

FOREIGN PATENT DOCUMENTS

| | | |
|---|---|---|
| JP | 2019-75394 A | 5/2019 |
| JP | 2019-75440 A | 5/2019 |
| WO | WO 2018/181979 A1 | 10/2018 |
| WO | WO 2018/190276 A1 | 10/2018 |

* cited by examiner

LIGHT DETECTION APPARATUS WITH ARRAY CONTROLLED BY SHIELDED LIGHT DETECTORS AND ELECTRONIC DEVICE

CROSS REFERENCE TO RELATED APPLICATIONS

This application is based upon and claims the benefit of priority from the prior Japanese Patent Application No. 2019-162235, filed on Sep. 5, 2019, the entire contents of which are incorporated herein by reference.

FIELD

Embodiments described herein relate generally to a light detection apparatus and an electronic device.

BACKGROUND

Light detection devices such as light receiving devices are widely used in automatic driving technology and the like. In the automatic driving technology, reflected light from an object is received by a light detection apparatus, a distance to the object is measured, and a distance image is generated. In order to increase the resolution of the distance image, it is necessary to increase the number of light receiving elements per unit area included in the light detection apparatus. However, when the distance between the light receiving elements decreases, crosstalk occurs between the light receiving elements, which results in causing blurring of the distance image and noise.

Further, it is necessary to apply a predetermined reverse bias voltage to each light receiving element in the light detection apparatus. However, the crosstalk, the noise, sensitivity, and a signal-to-noise ratio (SNR) are changed by the reverse bias voltage. Since it is desirable that the SNR be as large as possible, it is necessary to optimize the reverse bias voltage.

Furthermore, when an operation is performed in a Geiger mode using an avalanche photodiode as the light receiving element, a reset operation is required whenever light is received, and a period during which new light cannot be received (dead time) occurs until the resetting is completed. Although the dead time can be changed by adjusting a reset period, the crosstalk, the noise, the sensitivity, and the SNR are changed by the length of the dead time. As described above, it is necessary to satisfy various conditions in order to optimize the SNR.

DETAILED DESCRIPTION

According to one embodiment, a light detection apparatus has an array of first light detectors arranged at a first interval and configured to convert reception light into first signals, second light detectors comprising a first crosstalk rate and configured to convert reception light into second signals, wherein surfaces of the second light detectors are shielded from light, third light detectors comprising a second crosstalk rate different from the first crosstalk rate and configured to convert reception light into third signals, wherein surfaces of the third light detectors are shielded from light, and control circuitry configured to control an operation point of the array based on the second signals and the third signals.

Hereinafter, embodiments of a light detection apparatus, an electronic device, and a light detection method will be described with reference to the drawings. The following description focuses on main components of the light detection apparatus, the electronic device, and the light detection method. However, the light detection apparatus, the electronic device, and the light detection method may have components and functions that are not shown or described.

First Embodiment

Figure 1:
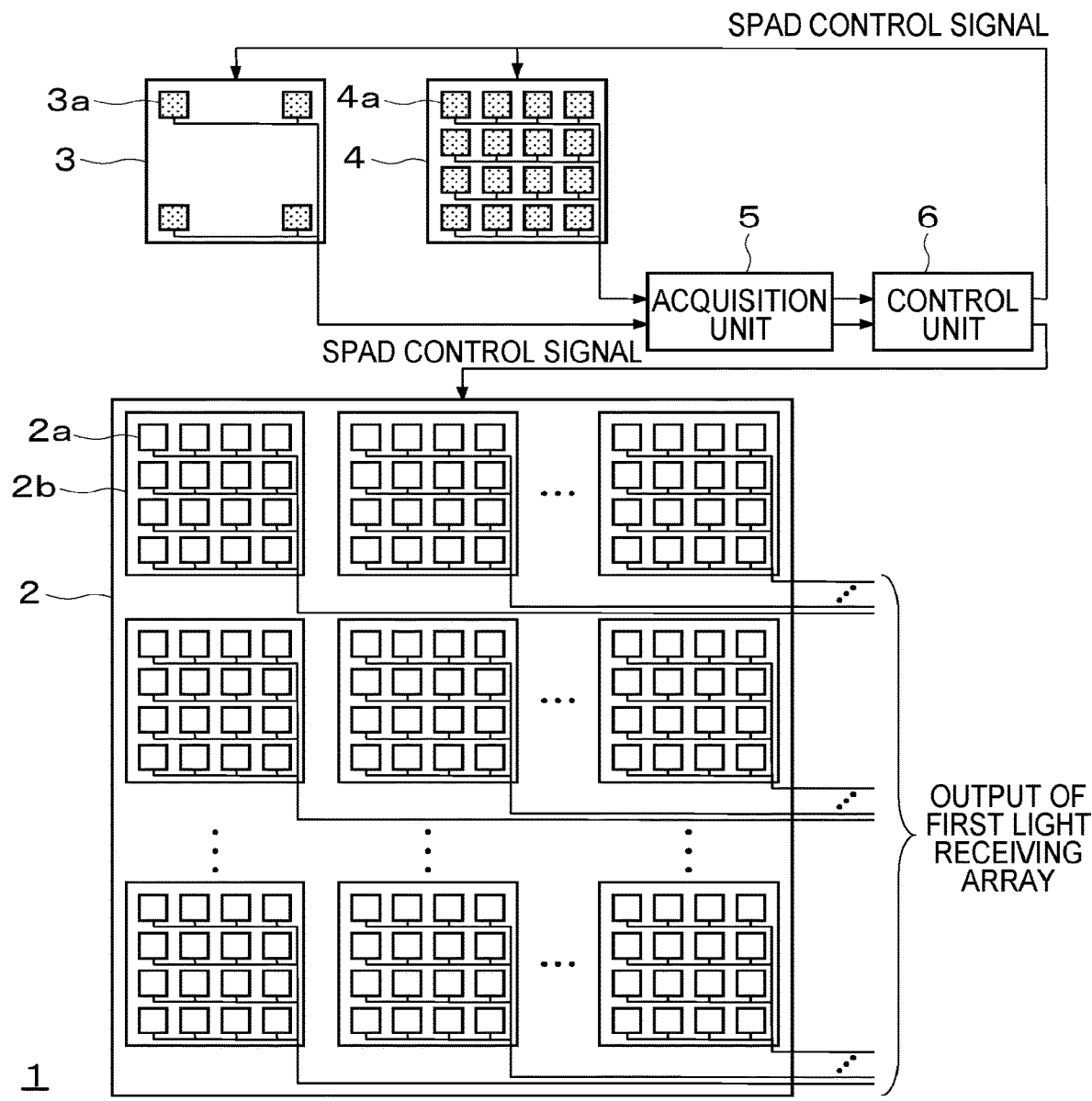
FIG. 1 is a block diagram showing a schematic configuration of a light detection apparatus according to a first embodiment.

FIG. 1 is a block diagram showing a schematic configuration of a light detection apparatus 1 according to a first embodiment. As will be described later, the light detection apparatus 1 of FIG. 1 is used to receive reflected light from an object, for example. The light detection apparatus 1 of FIG. 1 includes a first light receiving array (array) 2, a second light receiving array 3, a third light receiving array 4, an acquisition unit 5, and a control unit (control circuitry) 6.

The first light receiving array (first array) 2 has a plurality of first light receiving elements (first light detectors) 2a arranged at intervals. In an example of FIG. 1, the first light receiving array 2 has a plurality of pixels 2b arranged in a two-dimensional direction. Each pixel 2b has the plurality of first light receiving elements 2a arranged in a two-dimensional direction. In the present specification, an example in which a silicon photon avalanche diode (SPAD) is used as the first light receiving element 2a will be described. SPAD is an avalanche photodiode (APD) operated in a Geiger mode, and can output an electrical signal by receiving a single photon. In the example of FIG. 1, one pixel 2b is formed by 4×4 SPADs. However, the number and arrangement of SPADs forming one pixel 2b are arbitrary. A unit of one pixel 2b is also called a silicon photomultiplier (SiPM).

The first light receiving array 2 of FIG. 1 has a plurality of pixels 2b arranged in a two-dimensional direction, but may have a plurality of pixels arranged in a one-dimensional direction, that is, in a line. A plurality of SPADs arranged in each pixel 2b can also be arranged in a two-dimensional direction or a one-dimensional direction.

The second light receiving array 3 and the third light receiving array 4 are provided for calibration of the first light receiving array 2. The second light receiving array 3 has a plurality of second light receiving elements (second light detectors) 3a of which light receiving surfaces are shielded from light. Since the light receiving surface of the second light receiving element 3a is shielded from the light, the second light receiving array 3 cannot receive incident light. However, each second light receiving element 3a outputs a signal that is also called a dark current. The output signal of each second light receiving element 3a has a signal level according to noise and crosstalk rate. Here, the crosstalk rate is the probability that an adjacent light receiving element senses light emitted when a certain light receiving element receives light and outputs a large current, and outputs the large current. The crosstalk rate will be described in detail later.

For example, the plurality of second light receiving elements 3a in the second light receiving array 3 are arranged at wider intervals than the plurality of first light receiving elements 2a in the first light receiving array 2. The reason why the intervals between the plurality of second light receiving elements 3a are increased is to prevent the adjacent second light receiving elements 3a from being affected by the crosstalk. As will be described later, a modification in which the intervals between the first light receiving elements 2a and the intervals between the second light receiving elements 3a are the same is also conceivable. Therefore, whether the intervals between the first light receiving elements 2a and the intervals between the second light receiving elements 3a are the same or different is a design matter.

Light shielding of the light receiving surface of the second light receiving element 3a can be realized, for example, by covering the light receiving surface with a light shielding film not shown in the drawings. The light shielding film may be formed using a metal wiring by a metal wiring process in a manufacturing process of a semiconductor chip including the light detection apparatus 1. Alternatively, the light shielding film may be formed by a manufacturing process other than the metal wiring. Further, the light shielding film may be a sealing member that shields a light incidence window provided in a semiconductor package, instead of being formed by a film forming process at the time of manufacturing the semiconductor chip. In the example of FIG. 1, a total of four second light receiving elements 3a are provided at the same intervals as the first light receiving elements 2a at the four corner positions in the first light receiving array 2. The number of second light receiving elements 3a in the second light receiving array 3 is not necessarily four, and the second light receiving elements 3a may be arranged at intervals different from those of the first light receiving elements 2a at the four corner positions in the first light receiving array 2.

The third light receiving array 4 has a plurality of third light receiving elements (third light detectors) 4a of which light receiving surfaces are shielded from light. The plurality of third light receiving elements 4a have a crosstalk rate different from that of the plurality of second light receiving elements 3a. For example, the third light receiving elements 4a in the third light receiving array 4 are arranged at the same interval as the plurality of first light receiving elements 2a. As such, the arrangement and size of each pixel 2b in the third light receiving array 4 and the arrangement and size of each SPAD in each pixel 2b are common to the first light receiving array 2. In the present embodiment, the intervals between the plurality of third light receiving elements 4a are the same as the intervals between the plurality of first light receiving elements 2a. As a result, the first light receiving array 2 and the third light receiving array 4 have almost the same crosstalk rate.

In the present specification, the element structures and sizes of the first, second, and third light receiving elements 4a are common except that the light receiving surface is shielded from light. As described above, the first light receiving array 2 has the first light receiving elements 2a arranged at a first interval and configured to convert reception light into first signals. The second light receiving elements 3a have a first crosstalk rate and are configured to convert reception light into second signals. Surfaces of the second light receiving elements 3a are shielded from light. The third light receiving elements 4a have a second crosstalk rate different from the first crosstalk rate and are configured to convert reception light into third signals. Surfaces of the third light detectors are shielded from light. The control unit 6 is configured to control an operation point of the first light receiving array 2 based on the second signals and the third signals. The second light detectors may be arranged at a second interval different from the first interval, and the third light detectors may be arranged at the first interval.

When the plurality of first light receiving elements 2a receive light with a predetermined reverse bias voltage applied, the first light receiving elements 2a output photoelectrically converted electrical signals. As will be described later, when the reverse bias voltage is increased, the sensitivity of the first light receiving element 2a is improved. However, the noise is increased and the crosstalk rate is also increased.

The acquisition unit 5 acquires an output signal of the second light receiving array 3 and an output signal of the third light receiving array 4, and transmits the acquired output signals to the control unit 6. Note that the acquisition unit 5 may be integrated into the control unit 6.

The control unit 6 controls an operation point of the first light receiving array 2, on the basis of the output signals of the plurality of second light receiving elements 3a and the output signals of the plurality of third light receiving elements 4a. For example, the control unit 6 applies a reverse bias voltage to the plurality of second light receiving elements 3a and the plurality of third light receiving elements 4a, and estimates the magnitude of the noise and the magnitude of the crosstalk of the first light receiving array 2 and controls the operation point of the first light receiving array 2, on the basis of the output signals of the plurality of second light receiving elements 3a and the output signals of the plurality of third light receiving elements 4a. More specifically, the control unit 6 estimates the noise level and the crosstalk rate of the second light receiving array 3 while sweeping the reverse bias voltage to be applied to the plurality of second light receiving elements 3a and the plurality of third light receiving elements 4a, and controls the operation point of the first light receiving array 2 so that the signal-to-noise ratio is maximized.

The operation point is, for example, the reverse bias voltage of the first light receiving array 2. In this case, the control unit 6 controls the reverse bias voltage to be applied to the first light receiving array 2, on the basis of the output signals of the plurality of second light receiving elements 3a and the output signals of the plurality of third light receiving elements 4a. As will be described later, the operation point is not necessarily limited to the reverse bias voltage. The operation point is a value indicating an operation condition of the first light receiving array 2.

The control unit 6 does not necessarily need to estimate the crosstalk rate, and may estimate an index indicating the magnitude of the crosstalk instead of the crosstalk rate. Therefore, the control unit 6 controls the operation point of the first light receiving array 2, on the basis of the magnitude of the crosstalk between the second light receiving elements calculated by the output signals of the plurality of second light receiving elements 3a. Alternatively, the control unit 6 controls the operation point of the first light receiving array 2, on the basis of the magnitude of the crosstalk between the second light receiving elements calculated by the output signals of the plurality of second light receiving elements 3a and the output signals of the plurality of third light receiving elements 4a. Further, the control unit 6 may control the operation point of the first light receiving array 2, on the basis of the noise levels of the plurality of second light receiving elements 3a calculated by the output signals of the plurality of second light receiving elements 3a.

Next, an operation principle of the present embodiment will be described in detail. The number of the plurality of second light receiving elements 3a in the second light receiving array 3 is defined as M1, the number of the plurality of third light receiving elements 4a in the third light receiving array 4 is defined as M2, the crosstalk rates between the second light receiving elements 3a are defined as a1, the crosstalk rates between the third light receiving elements 4a are defined as a2, and the noises of the second light receiving element 3a and the third light receiving element 4a are defined as N. Since the second light receiving element 3a and the third light receiving element 4a are formed with the same structure and the same size in a common semiconductor process, the noises N become the same. An output signal S1 of the second light receiving array 3 and an output signal S2 of the third light receiving array are represented by the following formulas (1) and (2), respectively.

$$S1 = M1 \times N \times (1+a1) \tag{1}$$

$$S2 = M2 \times N \times (1+a2) \tag{2}$$

These M1, M2, S1, and S2 are known values. The noise N and the crosstalk rates a1 and a2 are variables. Since it is assumed that the intervals between the plurality of second light receiving elements 3a in the second light receiving array 3 is large so that the crosstalk can be ignored, in the case of M1=1, a1=0 can be obtained. At this time, the crosstalk rate a2 and the noise N can be estimated from the measurement values S1 and S2 of the output signals by the following formula (3).

$$a2 = S2 \times M1/(S1 \times M2) - 1 \tag{3}$$

$$N = S1/M1 \tag{4}$$

The crosstalk rates a1 and a2 depend on the manufacturing technology or the temperature of the SPAD and the operation point such as the reverse bias voltage. A ratio a=a1/a2 of the crosstalk rates depends on only the intervals between the SPADs. Therefore, by obtaining the ratio a in advance, even if the temperature or the setting condition of the SPAD are changed, the crosstalk rate a2 and the noise N can be obtained from the ratio a, the formulas (1), and (2), and the crosstalk rate a2 and the noise N are represented by the formulas (5) and (6), respectively.

$$a2 = (1-a) \times M1 \times S2/(M2 \times S1 - a \times M1 \times S2) - 1 \tag{5}$$

$$N = S2/(M2 \times (1+a2)) \tag{6}$$

Since the intervals between the third light receiving elements 4a in the third light receiving array 4 are the same as the intervals between the first light receiving elements 2a in the first light receiving array 2, the crosstalk rates between the first light receiving elements 2a in the first light receiving array 2 are the same as the crosstalk rates a2 between the third light receiving elements 4a in the third light receiving array 4. Therefore, the control unit 6 uses the control unit 6 to calculate optimum setting values of the plurality of first light receiving elements 2a in the first light receiving array 2 from the crosstalk rate a2 and the noise N obtained by the formulas (5) and (6), and controls the first light receiving element 2a, on the basis of the calculated values.

Figure 2:
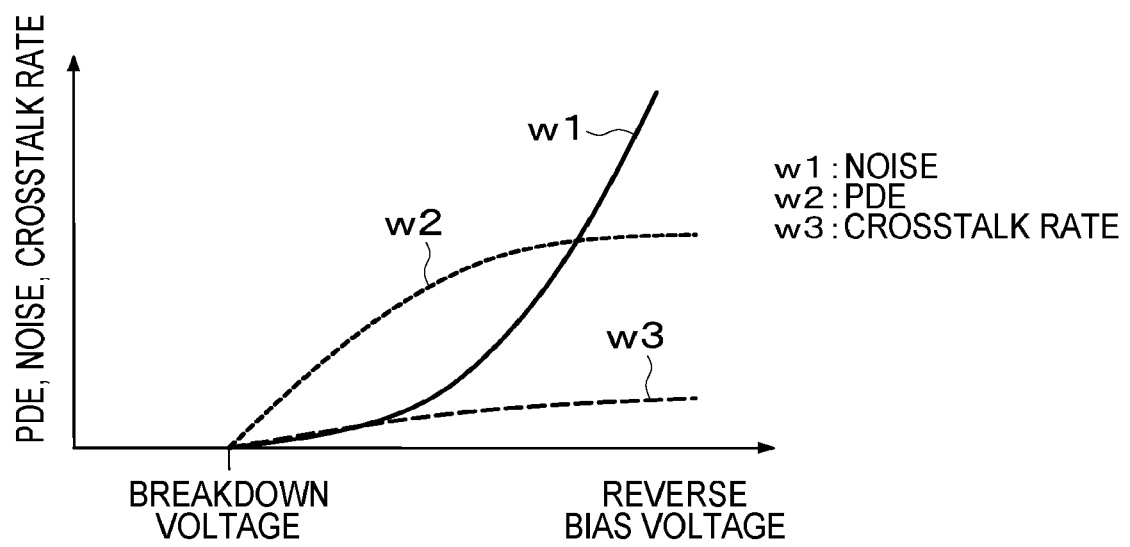
FIG. 2 is a graph showing an example of electrical characteristics of an SPAD.

Next, an example of calculation performed by the control unit 6 will be described. FIG. 2 is a graph showing an example of electrical characteristics of the SPAD. In FIG. 2, a horizontal axis represents a reverse bias voltage and a vertical axis represents electrical characteristic values of the SPAD, respectively. FIG. 2 shows graphs w1, w2, and w3 of the noise N, the probability PDE, and the crosstalk rate as the electrical characteristics of the SPAD. When the reverse bias voltage equal to or higher than the breakdown voltage is applied to the SPAD, the SPAD outputs a signal of a large current with the predetermined probability PDE at the time of receiving light. That the SPAD outputs the signal of the large current is also called ignition. However, the SPAD may be ignited without receiving light, and this is the noise N. The noise N and the probability PDE increase when the reverse bias voltage increases.

Furthermore, when the SPAD is ignited, the SPAD emits light with the predetermined probability, and another SPAD may be ignited due to the light. The synthesized probability of the above process is the crosstalk rate.

Figure 3:
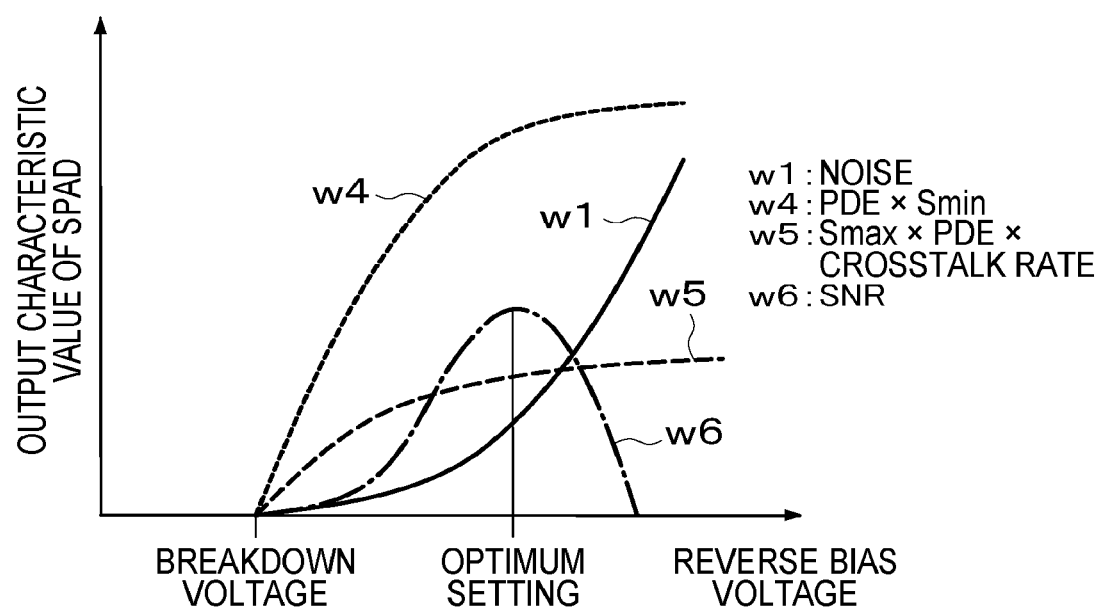
FIG. 3 is a graph showing an example of output characteristics of an SPAD.

FIG. 3 is a graph showing an example of output characteristics of the SPAD. In FIG. 3, a horizontal axis represents a reverse bias voltage and a vertical axis represents each output value of the SPAD. FIG. 3 shows graphs w4, w5, and w6 of PDE×Smin, Smax×PDE×crosstalk rate, and SNR, respectively. The graph of the noise N graph is the same as that in FIG. 2. Smin and Smax are a minimum value and a maximum value of the incident light intensity of the SPAD, respectively.

The minimum value of the output signal of the SPAD is PDE×Smin. The maximum value of the noise is a value when the incident light intensity of the adjacent SPAD becomes the maximum value Smax when the incident light intensity of the SPAD is the minimum value Smin, and the maximum value is represented by the following formula (7).

$$\text{Maximum value of noise} = N + \text{Smax} \times \text{PDE} \times \text{crosstalk rate} \tag{7}$$

A minimum value of the signal-to-noise ratio SNR of the received light signal is represented by the following formula (8).

$$\text{SNR} = \text{PDE} \times \text{Smin}/(N + \text{Smax} \times \text{PDE} \times \text{crosstalk rate}) \tag{8}$$

In order to maximize the SNR in the formula (8), not only the probability PDE and the noise N of the SPAD but also the crosstalk rate should be considered.

The performance of the SPAD changes depending on the temperature of the light detection apparatus 1. For example, in general, when the temperature increases, the breakdown voltage of the SPAD decreases, the characteristics of FIGS. 2 and 3 are shifted to the right side, and the optimum setting value of the SPAD increases.

Further, when the temperature increases, the kinetic energy of electrons increases, the probability PDE of igniting the SPAD with the kinetic energy of the electrons increases, and the noise N increases. When the breakdown voltage increases, a curve of the noise N extends upward while being shifted to the right side.

On the other hand, even if the temperature changes, the curve shapes of the PDE and the crosstalk rate hardly change in general. The reason is that main factors determining the PDE and the crosstalk rate are light absorptivity of a constituent material of the SPAD to be the light receiving element, and a structure of the SPAD, and hardly change with the temperature. Therefore, if a relation between the PDE and the crosstalk rate is obtained in advance, the PDE can be calculated from the crosstalk rate. Therefore, the SNR can be calculated from the formula (8) by obtaining the noise N and the crosstalk rate. Various methods for obtaining an optimum value of the signal-to-noise ratio SNR from the formula (8) can be considered. Two typical methods will be described below.

In the first method, the setting values (for example, the reverse bias voltage) of the second light receiving element 3a and the third light receiving element 4a in the second light receiving array 3 and the third light receiving array 4 are swept to obtain the noise and the crosstalk rate, and the SNR is calculated by the formula (8). That is, while the setting values of the second light receiving element 3a and the third light receiving element 4a are swept, the setting value when the SNR is maximized is set to an optimum setting value, and an optimum setting value of the first light receiving array 2 is determined on the basis of the setting value at this time. As a sweeping method, at the initial setting, a sweeping width of the reverse bias voltage is increased, and after obtaining the optimum setting value, the sweeping width may be decreased for temperature tracking, or sweeping may be performed with the same sweeping width at all times.

For example, the first method will be described on the basis of FIG. 3. When the reverse bias voltage of the second light receiving element 3a and the third light receiving element 4a is gradually increased from the breakdown voltage and the maximum value of the SNR is detected, the reverse bias voltage at that time is set as the optimum setting value and is used as the optimum setting value of the reverse bias voltage of the plurality of first light receiving elements 2a in the first light receiving array 2.

In the second method, the second light receiving element 3a and the third light receiving element 4a are controlled so that a denominator of the formula (8) becomes a predetermined value. For example, the reverse bias voltage to be applied to the second light receiving element 3a and the third light receiving element 4a is controlled and the denominator of the formula (8) is set as the predetermined value. Although accuracy is lower than that of the first method, it is not necessary to calculate a numerator of the formula (7), and calculation becomes simple.

The method of obtaining the optimum value of the SNR from the formula (8) by the control unit 6 is not necessarily limited to the first method or the second method described above. This is because an optimal setting method of the SPAD and the APD for maximizing the SNR can be changed according to various characteristics of the SPAD and the APD.

For example, if the SPAD receives light with the reverse bias voltage applied, a large current flows and a cathode voltage decreases, so that new light cannot be received in this state. For this reason, a quench circuit (not shown in the drawings) for forcibly increasing the cathode voltage is provided. A period from when the SPAD detects light and the cathode voltage decreases to when the cathode voltage returns to a desired voltage by the quench circuit is also referred to as a dead time, and the period is a period during which the SPAD cannot receive light. In order to forcibly shorten the dead time, an active quench circuit that rapidly increases the cathode voltage using a transistor or the like is used. However, if light is incident during an operation of increasing the cathode voltage by the active quench circuit, a large amount of current flows through the SPAD and emits light, and a current due to the crosstalk flows through the SPAD existing in the vicinity.

As described above, the SNR changes by controlling the dead time of the SPAD. Therefore, the control unit 6 may control the dead time of the SPAD in order to maximize the SNR of the formula (8). Therefore, the control of the operation point of the first light receiving array 2 described above may control the dead time.

In FIG. 1, the example in which the intervals between the second light receiving elements 3a in the second light receiving array 3 are wider than the intervals between the third light receiving elements 4a in the third light receiving array 4 has been described. However, the intervals between the second light receiving elements 3a and the intervals between the third light receiving elements 4a may be different from each other, and the intervals between the third light receiving elements 4a may be wider than the intervals between the second light receiving elements 3a. When a structure (for example, a shielding layer) for reducing the crosstalk between the second light receiving elements 3a adjacent to each other is provided, the intervals between the second light receiving elements 3a and the intervals between the third light receiving elements 4a may be the same. As described above, the intervals between the second light receiving elements 3a and the intervals between the third light receiving elements 4a are not necessarily different. The crosstalk rates of the second light receiving element 3a and the third light receiving element 4a may be different from each other.

As described above, in the first embodiment, in addition to the first light receiving array 2 receiving the reflected light from the object, the second light receiving array 3 and the third light receiving array 4 for calibration are provided. The noise and the crosstalk rate of the first light receiving array 2 are estimated from the output signal of the second light receiving array 3 and the output signal of the third light receiving array 4, and the operation point of the first light receiving array 2 is controlled so that the signal-to-noise ratio of the first light receiving array 2 is maximized. As a result, it is possible to set the operation point of the first light receiving array 2 for optimizing the signal-to-noise ratio of the first light receiving array 2 while minimizing an influence of the noise and the crosstalk rate of the first light receiving array 2.

In the present embodiment, it has been described that the crosstalk rate is simply calculated by using the second light receiving array and the third light receiving array, and the first light receiving array 2 is controlled. However, the crosstalk rate of the third light receiving array 4 can be obtained by performing signal processing on the basis of only the result of the third light receiving array 4. Therefore, it is possible to prepare only the third light receiving array 4 and calculate the crosstalk rate by the signal processing to control the first light receiving array.

Second Embodiment

In a second embodiment, only one light receiving array for calibration is provided.

Figure 4:
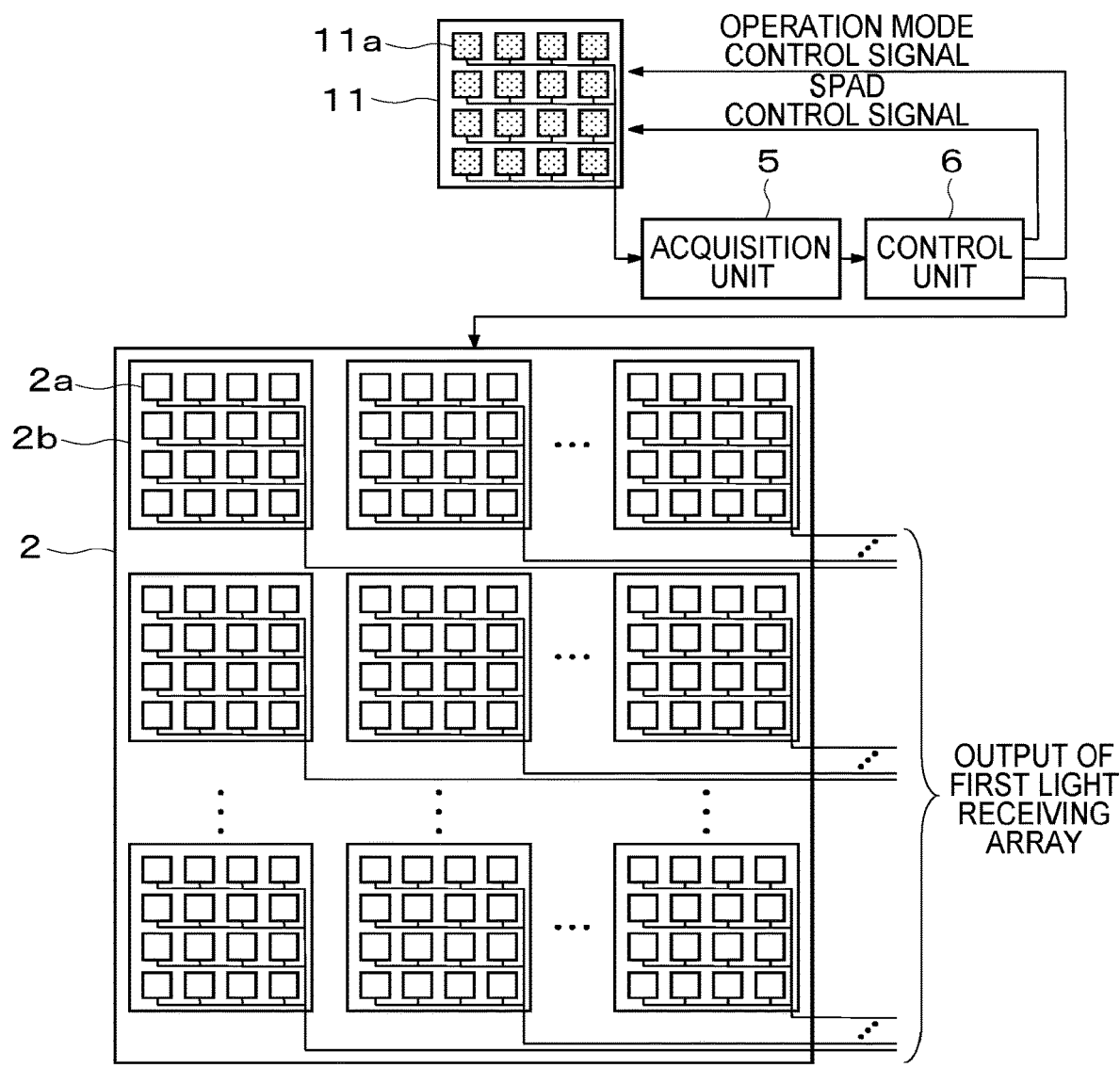
FIG. 4 is a block diagram showing a schematic configuration of a light detection apparatus according to a second embodiment.

FIG. 4 is a block diagram showing a schematic configuration of a light detection apparatus 1 according to the second embodiment. The light detection apparatus 1 of FIG. 4 includes a first light receiving array 2, a second light receiving array 11, an acquisition unit 5, and a control unit 6. Since the first light receiving array 2 of FIG. 4 is the same as the first light receiving array 2 of FIG. 1, the description thereof will be omitted.

The second light receiving array 11 of FIG. 4 has a plurality of second light receiving elements 11a of which light receiving surfaces are shielded from light. The plurality of second light receiving elements 11a are arranged at the same interval as a plurality of first light receiving elements 2a. Each of the plurality of second light receiving elements 11a can individually switch between an on state where a light receiving operation is performed and an off state where the light receiving operation is stopped, according to an instruction from the control unit 6. When the second light receiving element 11a is in the off state, the light receiving element does not ignite and does not emit noise. Therefore, the light receiving element does not perform light emission due to ignition that causes crosstalk. Each of the plurality of second light receiving elements 11a has a light shielding film covering the light receiving surface, for example.

The acquisition unit 5 acquires an output signal of the second light receiving array 11 and transmits the output signal to the control unit 6. The control unit 6 can switch between a first mode in which a part of the second light receiving elements 11a obtained by thinning out the plurality of second light receiving elements 11a at predetermined intervals (for example, equal intervals) is turned on and a second mode in which all of the plurality of second light receiving elements 11a are turned on. By switching between the first mode and the second mode, the control unit 6 controls an operation point of the first light receiving array 2, on the basis of output signals of a part of the second light receiving elements 11a obtained by thinning out the plurality of second light receiving elements 11a at the predetermined intervals and output signals of all the plurality of second light receiving elements 11a. As described above, the control unit 6 controls the operation point of the first light receiving array 2, on the basis of the output signals of the second light receiving elements at the time of not driving at least one of the other adjacent second light receiving elements among the plurality of second light receiving elements 11a and the output signals at the time of driving all the adjacent second light receiving elements among the plurality of second light receiving elements 11a.

Figure 5A:
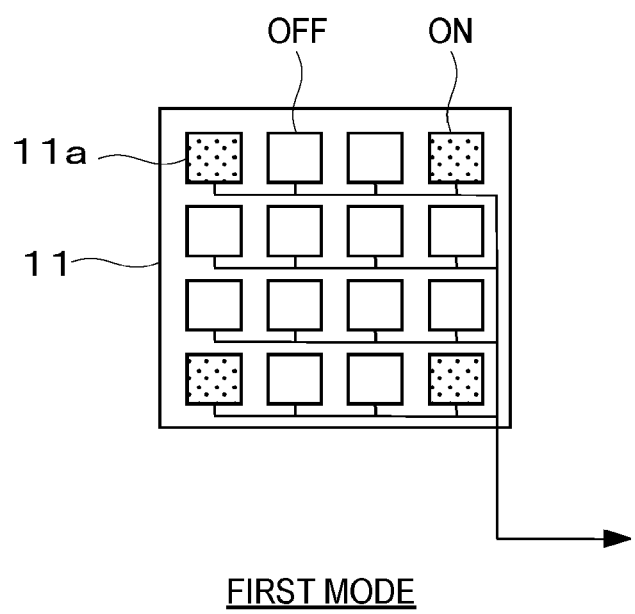
FIG. 5A is a diagram showing a state where only second light receiving elements at four corners are turned on in a first mode.
Figure 5B:
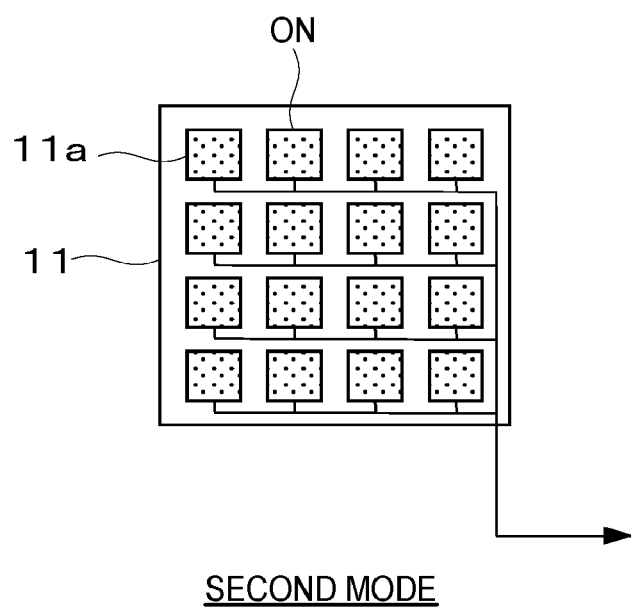
FIG. 5B is a diagram showing a state where all second light receiving elements are turned on in a second mode.

When the control unit 6 selects the first mode, among the plurality of second light receiving elements 11a, for example, only the second light receiving elements 11a at the four corners are turned on. The intervals between the second light receiving elements 11a in the on state in the first mode are the same as the intervals between the second light receiving elements 3a of FIG. 1. FIG. 5A shows a state where only the second light receiving elements 11a at the four corners are turned on in the first mode. FIG. 5B shows a state where all the second light receiving elements 11a are turned on in the second mode.

When the control unit 6 selects the second mode, all of the plurality of second light receiving elements 11a are turned on, so the intervals between the second light receiving elements 11a are narrower than the intervals in the first mode, and the crosstalk rate increases. The intervals between the second light receiving elements 11a in the on state in the second mode are the same as the intervals between the third light receiving elements 4a of FIG. 1.

The second light receiving array 11 of FIG. 4 performs the same operation as the second light receiving array 3 of FIG. 1 when the first mode is selected, and performs the same operation as the third light receiving array 4 of FIG. 1 when the second mode is selected. By switching between the first mode and the second mode while sweeping a reverse bias voltage, the control unit 6 estimates the noise N and the crosstalk rate, and The control unit 6 sets a reverse bias voltage when the signal-to-noise ratio SNR is maximized as a reverse bias voltage of the first light receiving array 2, on the basis of the formula (8). As described above, the control unit 6 applies the reverse bias voltage to the plurality of second light receiving elements 11a, and the control unit 6 estimates the magnitudes of the noise and the crosstalk of the first light receiving array 2 and controls the operation point of the first light receiving array 2, on the basis of the output signals of the plurality of second light receiving elements 11a. Alternatively, the control unit 6 may control timing at which a quench circuit not shown in the drawings sets a voltage of the corresponding first light receiving element 2a to an initial voltage, on the basis of the output signals of all of the plurality of second light receiving elements 11a and the output signals of a part of the second light receiving elements 11a obtained by thinning out the plurality of second light receiving elements 11a at the predetermined intervals. That is, a dead time of the first light receiving element 2a may be controlled.

As described above, in the second embodiment, by switching between turning on a part of the plurality of second light receiving elements 11a in the second light receiving array 11 for calibration and turning on all of the plurality of second light receiving elements 11a, similar to the first embodiment, it is possible to set the operation point of the first light receiving array 2 for optimizing the signal-to-noise ratio of the first light receiving array 2 while minimizing an influence of the noise and the crosstalk rate of the first light receiving array 2.

Further, in the second embodiment, as compared with the first embodiment, the number of light receiving arrays for calibration can be reduced, and a size of the light detection apparatus 1, a member cost, and power consumption can be reduced.

Third Embodiment

In a third embodiment, a signal-to-noise ratio of a first light receiving array 2 is optimized by a method different from that of the second embodiment.

Figure 6:
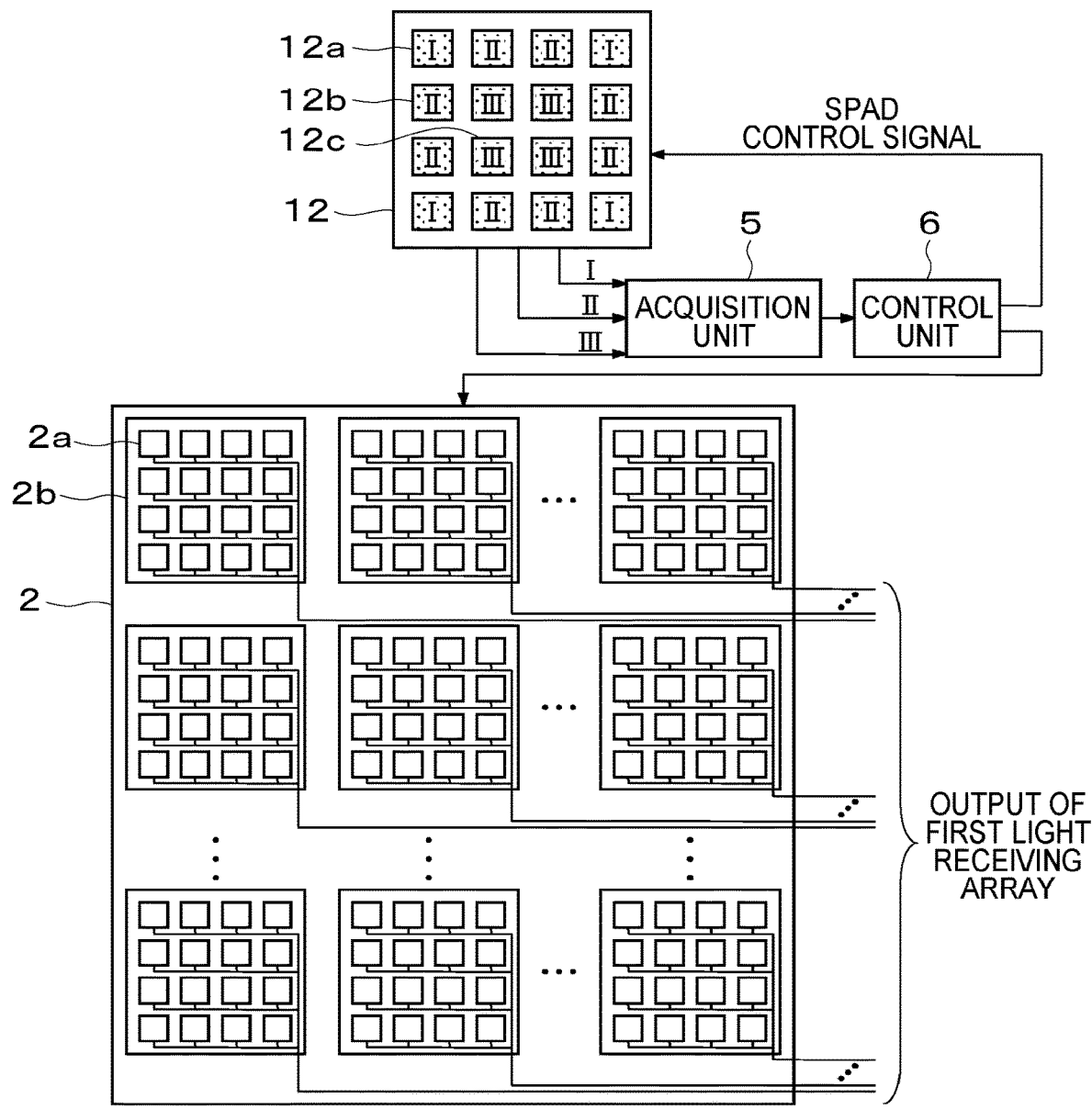
FIG. 6 is a block diagram showing a schematic configuration of a light detection apparatus according to a third embodiment.

FIG. 6 is a block diagram showing a schematic configuration of a light detection apparatus 1 according to the third embodiment. The light detection apparatus 1 of FIG. 6 includes a first light receiving array 2, a second light receiving array 12, an acquisition unit 5, and a control unit 6. Since the first light receiving array 2 of FIG. 6 is the same as the first light receiving array 2 of FIG. 1, the description thereof will be omitted.

The second light receiving array 12 of FIG. 6 has a plurality of second light receiving elements 12a, 12b, and 12c of which light receiving surfaces are covered with a light shielding film. The plurality of second light receiving elements 12a, 12b, and 12c are arranged at the same intervals as a plurality of first light receiving elements 2a. The plurality of second light receiving elements 12a, 12b, and 12c are turned on at the same time. However, output signals indicating light receiving results of the plurality of second light receiving elements 12a, 12b, and 12c are divided into three output systems depending on arrangement places of the plurality of second light receiving elements 12a, 12b, and 12c.

In FIG. 6, the second light receiving elements 12a, 12b, and 12c connected to the three output systems are classified by attaching I, II, and III. The second light receiving element 12a of I comes in contact with two other second light receiving elements 12b and 12c. The second light receiving element 12b of II comes in contact with three other second light receiving elements 12a, 12b, and 12c. The second light receiving element 12c of III comes in contact with four other second light receiving elements 12b and 12c. Since a crosstalk rate increases as the number of other second light receiving elements coming in contact with each other increases, the second light receiving element 12c of III has the highest probability of ignition due to crosstalk, the second light receiving element 12a of I has the lowest probability of ignition due to the crosstalk, and the second light receiving element 12b of II has the intermediate probability of ignition due to the crosstalk.

If the crosstalk rates of I, II, and III are a1, a2, and a3, respectively, and the main cause of the crosstalk is the presence of adjacent SPADs, the following formula (9) is established.

$$a1/2 = a2/3 = a3/4 \qquad (9)$$

When the numbers of SPADs of I, II, and III described above are M1, M2, and M3, respectively, outputs S1, S2, and S3 of the respective SPADs are represented by the following formulas (10) to (12).

$$S1 = M1*N*(1+a1) \qquad (10)$$

$$S2 = M2*N*(1+a2) \qquad (11)$$

$$S3 = M3*N*(1+a3) \qquad (12)$$

There are four variables a1, a2, a3, and N in the formulas (9) to (12), and there are also four formulas. By solving these formulas, these variables a1, a2, a3, and N can be obtained.

The crosstalk rate of the first light receiving array 2 depends on the arrangement of the plurality of first light receiving elements 2a in the first light receiving array 2. However, generally, it is considered that a ratio of one first light receiving element 2a coming in contact with the four first light receiving elements 2a is high, like III of FIG. 6, and the crosstalk rate a3 is applied. Therefore, by solving the formulas (9) to (12), the noise and the crosstalk rate of the first light receiving array 2 can be estimated, and by using the same method as the first embodiment, a reverse bias voltage and a dead time of the first light receiving array 2 can be set to optimize a signal-to-noise ratio of the first light receiving array 2.

As described above, in the third embodiment, the output signals of the second light receiving array 12 are divided into the plurality of output systems according to how many light receiving elements each light receiving element in the second light receiving array 12 for calibration comes into contact with. As a result, the noise and the crosstalk rate of the first light receiving array 2 can be estimated by the formulas (9) to (12), and the signal-to-noise ratio of the first light receiving array 2 can be optimized using the estimation result.

Fourth Embodiment

In a fourth embodiment, a reverse bias voltage or the like of each of first light receiving elements 2a is set in consideration of arrangement places of the first light receiving elements 2a in a first light receiving array 2.

Figure 7:
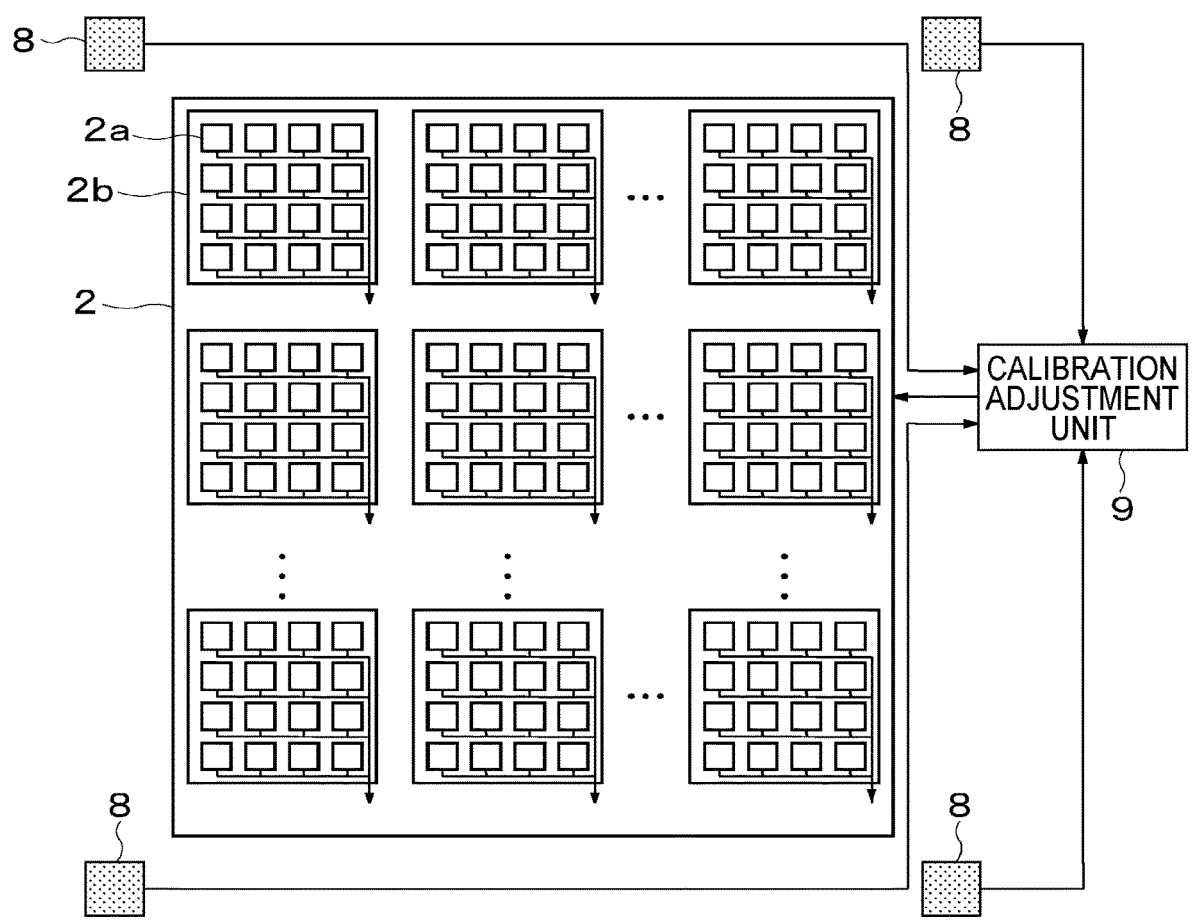
FIG. 7 is a block diagram showing a schematic configuration of a light detection apparatus according to a fourth embodiment.

FIG. 7 is a block diagram showing a schematic configuration of a light detection apparatus 1 according to the fourth embodiment. The light detection apparatus 1 of FIG. 7 includes a first light receiving array 2 having a plurality of first light receiving elements 2a arranged in a two-dimensional direction, a plurality of calibration units (calibration circuitries) 8, and a calibration adjustment unit (calibration adjuster) 9.

The plurality of calibration units 8 are arranged at three or more places around the first light receiving array 2. Each calibration unit 8 can be configured using the light detection apparatus 1 according to the first to third embodiments.

The calibration adjustment unit 9 calibrates operation points of the plurality of first light receiving elements 2a, on the basis of information of an optimum operation point of the first light receiving array 2 obtained by the respective control units 6 of the plurality of calibration units 8, positions of the plurality of calibration units 8, and positions of the plurality of first light receiving elements 2a.

First, the operation principle of the present embodiment will be described. If a size of the first light receiving array 2 increases, characteristics of the plurality of first light receiving elements 2a are not necessarily constant due to variations in manufacturing and the like, and the characteristics change depending on the arrangement places of the first light receiving elements 2a. There are two types of characteristic changes including a random mismatch and a gradient mismatch. In the random mismatch, since the characteristics change randomly, accurate characteristic values are not known unless the characteristics of the individual first light receiving elements 2a are measured. However, a value of the random mismatch is generally smaller than a value of the gradient mismatch. For this reason, in the present embodiment, the random mismatch is ignored.

Figure 8:
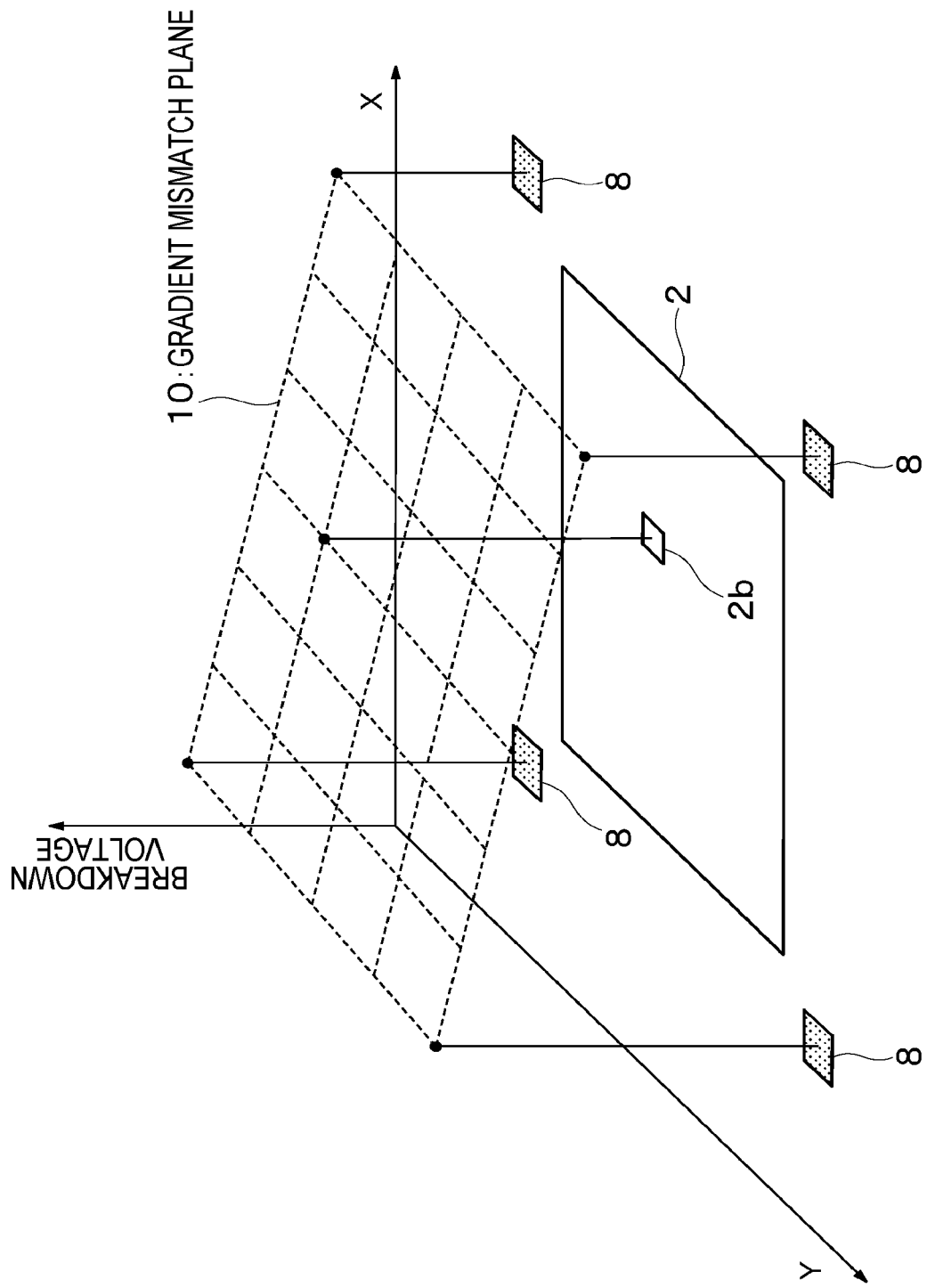
FIG. 8 is a diagram showing an example in which a breakdown voltage changes depending on an arrangement place of a first light receiving element.

On the other hand, in the gradient mismatch, the characteristic values change depending on the arrangement places of the first light receiving elements 2a. FIG. 8 is a diagram illustrating the gradient mismatch. FIG. 8 shows an example in which a breakdown voltage changes depending on the arrangement places of the first light receiving elements 2a. FIGS. 7 and 8 show an example in which the calibration units 8 are arranged at the four corners of the first light receiving array 2. However, the number of calibration units 8 may be three or more, and the calibration units 8 do not need to be arranged at the four corners of the first light receiving array 2.

In the example of FIG. 8, an example in which the breakdown voltage changes linearly is shown by a broken line. The broken line is also called a gradient mismatch plane 10. By the method described in the first to third embodiments, the plurality of calibration units 8 use the second light receiving array 3 (and the third light receiving array 4) to calculate setting information of the optimum operation point of the first light receiving array 2, and notifies the calibration adjustment unit 9 of a calculation result.

On the basis of the setting information of the optimum operation point of the first light receiving array 2 calculated by the plurality of calibration units 8, the positions of the plurality of calibration units 8, and the positions of the plurality of first light receiving elements 2a, the calibration adjustment unit 9 calculates the gradient mismatch plane 10 shown in FIG. 8, and calculates optimum setting information according to the position of each first light receiving element 2a.

The calibration adjustment unit 9 does not need to perform calculation using the gradient mismatch plane 10 for each first light receiving element 2a in the first light receiving array 2, and the calculations may be performed collectively for the plurality of first light receiving elements 2a arranged in close places. As described above, by classifying the plurality of first light receiving elements 2a in the first light receiving array into several groups and calculating the optimum setting information using the gradient mismatch plane 10 for each group, the number of control signal lines output from the first light receiving array 2 can be reduced, and the calculation amount of the calibration adjustment unit 9 can be reduced.

As described above, in the fourth embodiment, in view of the fact that the electrical characteristics of the first light receiving elements 2a change depending on the arrangement places of the first light receiving elements 2a in the first light receiving array 2, the optimum setting information of the first light receiving array 2 calculated by the calibration units 8 arranged around the first light receiving array 2 is calibrated according to the arrangement places of the first light receiving elements 2a. Therefore, even if the size of the first light receiving array 2 is large, a reverse bias voltage or the like can be set for each of the first light receiving elements 2a in the first light receiving array 2 in consideration of the arrangement places.

Fifth Embodiment

In the fourth embodiment, an example of calibrating a gradient mismatch when a plurality of first light receiving elements 2a in a first light receiving array 2 are arranged in a two-dimensional direction has been shown. However, in a fifth embodiment, an example of calibrating the gradient mismatch when the plurality of first light receiving elements 2a in the first light receiving array 2 are arranged in a one-dimensional direction, that is, in a line is shown.

Figure 9:
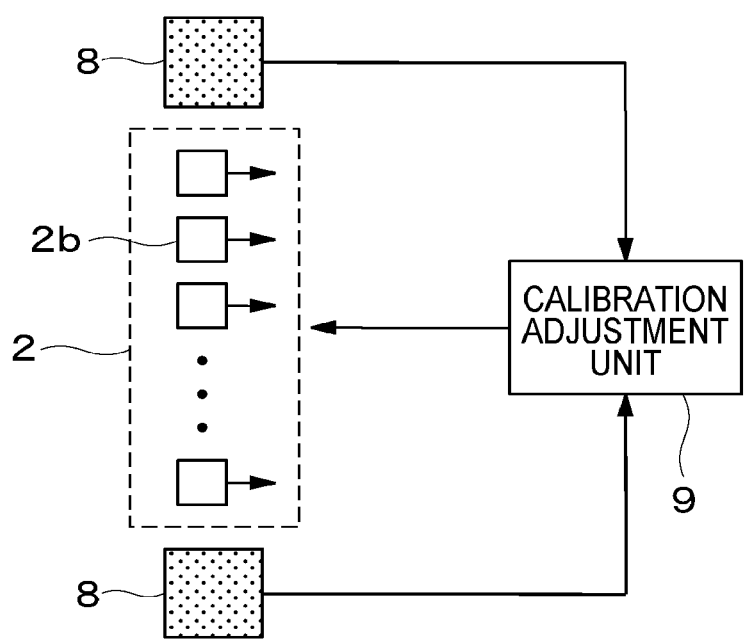
FIG. 9 is a block diagram showing a schematic configuration of a light detection apparatus according to a fifth embodiment.

FIG. 9 is a block diagram showing a schematic configuration of a light detection apparatus 1 according to the fifth embodiment. The first light receiving array 2 in the light detection apparatus 1 of FIG. 9 has a plurality of first light receiving elements 2a arranged in a line. The light detection apparatus 1 of FIG. 9 has two calibration units 8 arranged on both ends of the plurality of first light receiving elements 2a arranged in a line and a calibration adjustment unit 9. Each calibration unit 8 can be configured using the light detection apparatus 1 according to the first to third embodiments.

The calibration adjustment unit 9 calibrates operation points of the plurality of first light receiving elements 2a, on the basis of information of an optimum operation point of the first light receiving array 2 obtained by the respective control units 6 of the two calibration units 8, positions of the calibration units 8, and positions of the plurality of first light receiving elements 2a.

Characteristic values of the plurality of first light receiving elements 2a arranged in a line change depending on the linear positions. The characteristic change is the gradient mismatch, and the gradient mismatch can be calibrated according to the linear position of each first light receiving element 2a. Therefore, the calibration adjustment unit 9 calculates optimum setting information according to the position of each first light receiving element 2a, on the basis of the linear position of each first light receiving element 2a, the setting information of the optimum operation point of the first light receiving array 2 calculated by the two calibration units 8, and the positions of the two calibration units 8.

The calibration adjustment unit 9 does not need to calculate the optimum setting information in consideration of the gradient mismatch for all the first light receiving elements 2a in the first light receiving array 2, and after calculating the optimum setting information in consideration of the gradient mismatch for the representative first light receiving element 2a, the calibration adjustment unit 9 may calculate the optimum setting information of the other first light receiving elements 2a by interpolation processing.

As described above, in the fifth embodiment, when the plurality of first light receiving elements 2a in the first light receiving array 2 are arranged in a line, the two calibration units 8 are arranged on both ends thereof, so that it is possible to calculate the optimum setting information of each first light receiving element 2a in consideration of the gradient mismatch more easily than the fourth embodiment.

Figure 10:
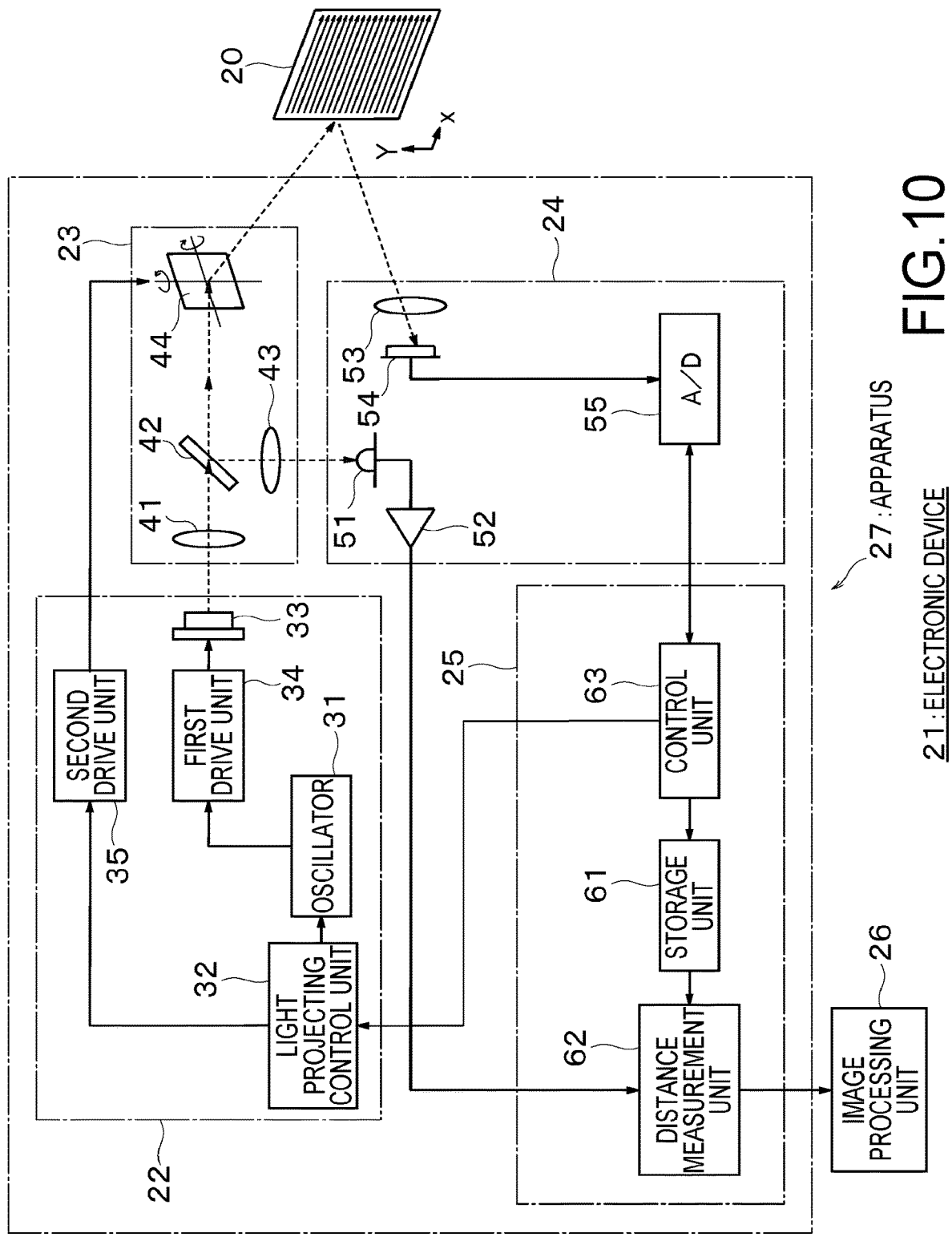
FIG. 10 is a block diagram showing a schematic configuration of an electronic device including a light receiving unit that incorporates the light detection apparatus according to the present embodiment.

The light detection apparatus 1 according to the first to fifth embodiments described above can be incorporated into an electronic device that performs distance measurement using a Time of Flight (ToF) method. FIG. 10 is a block diagram showing a schematic configuration of an electronic device 21 including a light receiving unit (light detector) 24 in which the light detection apparatus 1 according to the present embodiment is built. The electronic device 21 of FIG. 10 includes a light projecting unit 22, a light control unit 23, a light receiving unit 24, a signal processing unit 25, and an image processing unit 26. Among these units, the light projecting unit 22, the light control unit 23, the light receiving unit 24, and the signal processing unit 25 constitute a distance measurement device 27. The light detection apparatus 1 according to the first to fifth embodiments described above is mounted as at least a part of the light receiving unit 24.

At least a part of the electronic device 21 of FIG. 10 can be configured by one or more semiconductor integrated circuits (ICs). For example, the signal processing unit 25 and the image processing unit 26 may be integrated into one semiconductor chip, or the light receiving unit 24 may be further integrated into the semiconductor chip. The light projecting unit 22 may be further integrated into the semiconductor chip.

The light projecting unit 22 projects first light. The first light is, for example, a laser beam in a predetermined frequency band. The laser beam is coherent light having the same phase and frequency. The light projecting unit 22 projects the pulsed first light intermittently at a predetermined cycle. The cycle at which the light projecting unit 22 projects the first light is a time interval that is equal to or longer than a time required to measure a distance by the distance measurement device 27 on the basis of one pulse of the first light.

The light projecting unit 22 has an oscillator 31, a light projecting control unit 32, a light source 33, a first drive unit 34, and a second drive unit 35. The oscillator 31 generates an oscillation signal according to the cycle at which the first light is projected. The first drive unit 34 intermittently supplies power to the light source 33 in synchronization with the oscillation signal. The light source 33 intermittently emits the first light on the basis of the power from the first drive unit 34. The light source 33 may be a laser element that emits a single laser beam, or may be a laser unit that emits a plurality of laser beams simultaneously. The light projecting control unit 32 controls the second drive unit 35 in synchronization with the oscillation signal. The second drive unit 35 supplies a drive signal synchronized with the oscillation signal to the light control unit 23, according to an instruction from the light projecting control unit 32.

The light control unit 23 controls a traveling direction of the first light emitted from the light source 33. Further, the light control unit 23 controls a traveling direction of the received second light.

The light control unit 23 has a first lens 41, a beam splitter 42, a second lens 43, and a scanning mirror 44.

The first lens 41 collects the first light emitted from the light projecting unit 22 and guides the first light to the beam splitter 42. The beam splitter 42 branches the first light from the first lens 41 in two directions and guides the branched light to the second lens 43 and the scanning mirror 44. The second lens 43 guides the branched light from the beam splitter 42 to the light receiving unit 24. The reason why the first light is guided to the light receiving unit 24 is to detect light projecting timing in the light receiving unit 24.

The scanning mirror 44 rotationally drives a mirror plane in synchronization with the drive signal from the second drive unit 35 in the light projecting unit 22. Thereby, a reflection direction of the branched light (first light) incident on the mirror plane of the scanning mirror 44 after passing through the beam splitter 42 is controlled. By rotationally driving the mirror plane of the scanning mirror 44 at a constant cycle, the first light emitted from the light control unit 23 can be scanned in at least a one-dimensional direction. By providing shafts for rotationally driving the mirror plane in two directions, the first light emitted from the light control unit 23 can be scanned in a two-dimensional direction. FIG. 10 shows an example in which the scanning mirror 44 scans the first light projected from the electronic device 21 in an X direction and a Y direction.

When an object 20 exists within a scanning range of the first light projected from the electronic device 21, the first light is reflected by the object 20. At least a part of the reflected light reflected by the object 20 travels in a reverse direction along the substantially same path as the first light and is incident on the scanning mirror 44 in the light control unit 23. The mirror plane of the scanning mirror 44 is rotationally driven at a predetermined cycle. However, since the laser beam propagates at the speed of light, the reflected light from the object 20 is incident on the mirror plane while an angle of the mirror plane of the scanning mirror 44 hardly changes. The reflected light from the object 20 incident on the mirror plane is received by the light receiving unit 24.

The light receiving unit 24 has a light detector 51, an amplifier 52, a third lens 53, a light receiving sensor 54, and an A/D converter 55. The light detector 51 receives the light branched by the beam splitter 42 and converts the light into an electrical signal. The light detector 51 can detect the light projecting timing of the first light. The amplifier 52 amplifies the electrical signal output from the light detector 51.

The third lens 53 causes the laser beam reflected by the object 20 to form an image on the light receiving sensor 54. The light receiving sensor 54 receives the laser beam and converts the laser beam into an electrical signal. As the light receiving sensor 54, the light detection apparatus 1 according to the first to fifth embodiments described above can be applied. The light receiving sensor 54 is also called a silicon photomultiplier (SiPM).

The A/D converter 55 samples the electrical signal output from the light receiving sensor 54 at a predetermined sampling rate, performs A/D conversion, and generates a digital signal.

The signal processing unit 25 measures the distance to the object 20 having reflected the first light, and stores a digital signal corresponding to the second light in the storage unit 61. The signal processing unit 25 has a storage unit 61, a distance measurement unit 62, and a control unit 63.

The distance measurement unit 62 measures the distance to the object 20, on the basis of the first light and the reflected light. More specifically, the distance measurement unit 62 measures the distance to the object, on the basis of a time difference between the light projecting timing of the first light and the light receiving timing of the reflected light included in the second light received by the light receiving sensor 54. That is, the distance measurement unit 62 measures the distance on the basis of the following formula (13).

Distance=speed of light×(light receiving timing of reflected light−light projecting timing of first light)/2  (13)

The "light receiving timing of the reflected light" in the formula (13) is more accurately light receiving timing of a peak position of the reflected light. The distance measurement unit 62 detects the peak position of the reflected light included in the second light, on the basis of the digital signal generated by the A/D converter 55.

Figure 11:
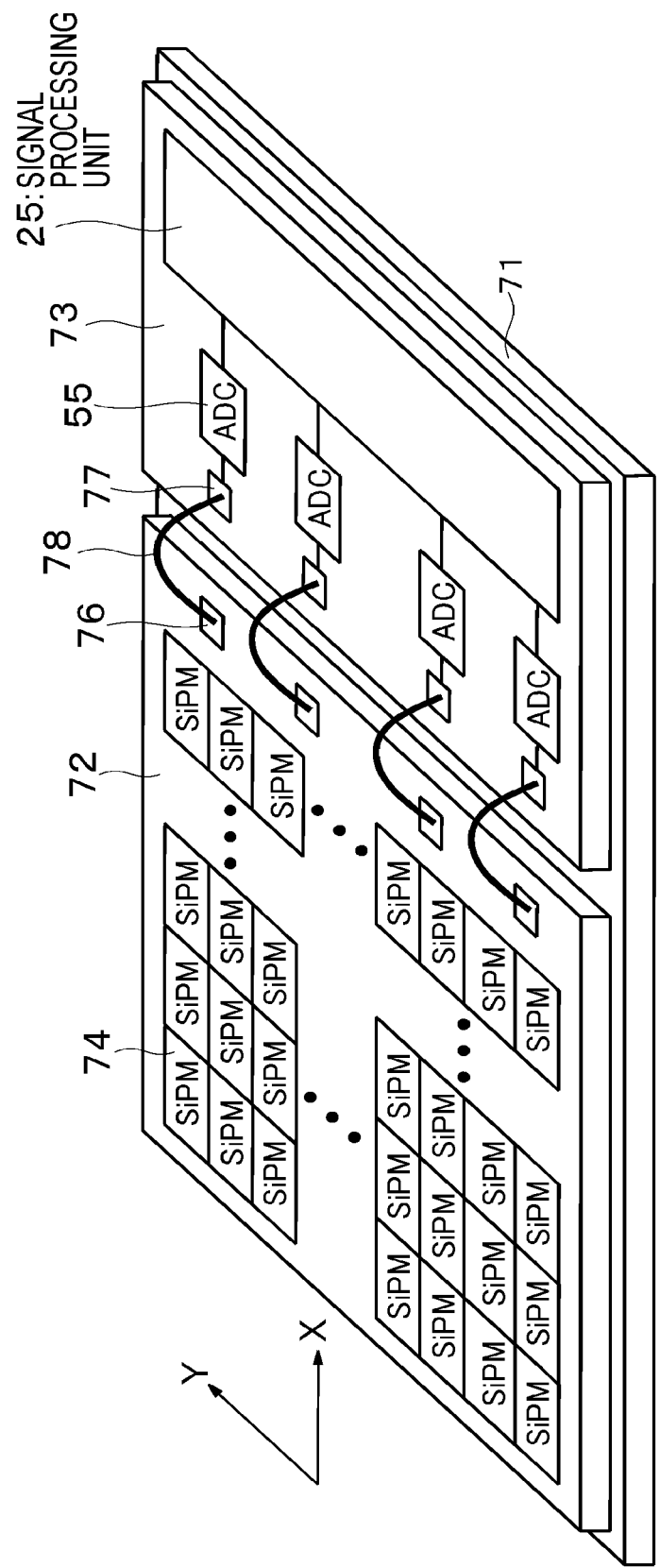
FIG. 11 is a schematic perspective view showing an example in which a light receiving unit and a signal processing unit are mounted on a semiconductor substrate.

At least a part of the electronic device 21 according to the present embodiment can be mounted by Silicon in Package (SiP). FIG. 11 is a schematic perspective view showing an example in which the light receiving unit 24 and the signal processing unit 25 are mounted on a substrate of a package. A first die 72 and a second die 73 are provided on a substrate 71 of FIG. 11. The light receiving sensor 54 in the light receiving unit 24 of FIG. 1 is disposed on the first die 72. The light receiving sensor 54 is an SiPM 74 having the light detection apparatus 1 according to the first to fourth embodiments described above. A plurality of SiPMs 74 are arranged in the X direction and the Y direction. The A/D converter (ADC) 55 and the signal processing unit 25 in the light receiving unit 24 of FIG. 1 are disposed on the second die 73. A pad 76 on the first die 72 and a pad 77 on the second die 73 are connected by a bonding wire 78.

In the layout diagram of FIG. 11, the plurality of SiPMs 74 are disposed on the first die 72. However, an active quench circuit or a passive quench circuit for shortening the dead time of the APD may be disposed in association with each SiPM 74.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A light detection apparatus comprising:
an array that comprises a plurality of first light detectors arranged at a first interval and configured to convert reception light into first signals;
second light detectors that are arranged at the first interval and configured to output second signals depending on a dark current, wherein surfaces of the second light detectors are shielded from light; and control circuitry that controls an operation point of the array, on a basis of the second signals of a portion of the second light detectors at a time of driving the portion of second light detectors among the second light detectors and the second signals at a time of driving all of the second light detectors.

2. The light detection apparatus according to claim 1, wherein the first light detectors and the second light detectors output the first and second signals photoelectrically converted at a time of receiving light in a state where a predetermined reverse bias voltage is applied, and the control circuitry applies the reverse bias voltage to the second light detectors, and estimates magnitudes of noise and crosstalk of the array and controls the operation point of the array, on the basis of the second signals of the second light detectors.

3. The light detection apparatus according to claim 2, wherein the control circuitry controls the reverse bias voltage of the array, on the basis of the second signals of the portion of second light detectors at the time of driving the portion of second light detectors among the second light detectors and the second signals at the time of driving all of the second light detectors.

4. The light detection apparatus according to claim 1, further comprising: a reset circuit that is provided to correspond to at least one of the first light detectors and sets a voltage at one end of a corresponding first light receiving element to an initial voltage after the corresponding first light receiving element receives light, wherein the control circuitry controls an operation point to cause the reset circuit to set the voltage of the corresponding first light receiving element to the initial voltage, on a basis of the second signals of all the second light detectors and the second signals of a part of the second light detectors obtained by thinning out the second light detectors at predetermined intervals.

5. A light detection apparatus comprising:

an array of first light detectors arranged at a first interval and configured to convert reception light into first signals;

second light detectors configured to output second signals and third signals depending on a dark current, wherein surfaces of the second light detectors are shielded from light; and control circuitry configured to control an operation point of the array based on the second signals and the third signals, wherein at least two of the second light detectors arranged at the first interval output the second signals depending on the dark current; and at least two of the second light detectors arranged at a second interval wider than the first interval output the third signals depending on the dark current.

6. The light detection apparatus according to claim 5, wherein the at least two of the second light detectors which output the second signals comprise a first crosstalk rate, the at least two of the second light detectors which output the third signals comprise a second crosstalk rate different from the first crosstalk rate, and surfaces of the at least two of the second light detectors are shielded from light.

7. The light detection apparatus according to claim 5, wherein the first light detectors at a time of driving all of the second light detectors output the second signals depending on the dark current; and a portion of the second light detectors at a time of driving the portion of the second light detectors among the second light detectors output the third signals depending on the dark current.

8. The light detection apparatus according to claim 5, further comprising a first second light receiving element group and a second second light receiving element group, each having a different number of adjacent second light detectors, among the second light detectors, wherein the first second light receiving element group outputs the second signal depending on the dark current, and the second second light receiving element group outputs the third signal depending on the dark current.

* * * * *